United States Patent [19]

Troutman

[11] Patent Number: 5,515,014

[45] Date of Patent: May 7, 1996

[54] INTERFACE BETWEEN SAW FILTER AND GILBERT CELL MIXER

[75] Inventor: Dennis L. Troutman, Gahanna, Ohio

[73] Assignee: AT&T Corp., Murray Hill, N.J.

[21] Appl. No.: 346,668

[22] Filed: Nov. 30, 1994

[51] Int. Cl.⁶ .............................. H03C 1/02; H03H 9/52; H04B 1/04; H04N 7/10
[52] U.S. Cl. ................. 332/178; 332/135; 332/146; 333/193; 348/11; 348/12; 375/257; 455/5.1; 455/118; 455/333
[58] Field of Search ................... 332/135, 136, 332/146, 178; 327/356, 359; 331/107 A; 333/193, 218, 194, 195, 196; 395/257, 258; 348/7, 10, 11, 12, 13; 455/5.1–6.3, 73, 108, 112, 118, 323–325, 333

[56] References Cited

U.S. PATENT DOCUMENTS

| | | | |
|---|---|---|---|
| 4,553,161 | 11/1985 | Citta | 348/10 |
| 4,682,344 | 7/1987 | Somer | 332/102 X |
| 5,051,709 | 9/1991 | Birkett et al. | 333/152 X |
| 5,170,500 | 12/1992 | Broderick | 455/315 |
| 5,329,319 | 7/1994 | Sgrignoli | 455/333 X |
| 5,379,457 | 1/1995 | Nguyen | 455/333 X |
| 5,410,742 | 4/1995 | Yajima | 333/193 X |

*Primary Examiner*—David Mis

[57] ABSTRACT

The invention concerns multipliers used to modulate a carrier by a signal. The signal is delivered by a Surface Acoustic Wave (SAW) filter, which requires a load impedance of low value, in the range of tens of ohms, and almost certainly less than 200 ohms. The invention modifies a Gilbert multiplier such that its signal-input stage presents the required load impedance to the SAW. The input impedance of the signal-input stage is adjustable.

12 Claims, 9 Drawing Sheets

INTERFACE BETWEEN SAW FILTER AND GILBERT CELL MIXER

The invention concerns impedance-matching topology which interconnects a Surface Acoustic Wave (SAW) filter and a Gilbert Cell multiplier, or mixer.

BACKGROUND OF THE INVENTION

The Inventor believes that the cable television industry is at the doorstep of a major transformation from acting primarily as a supplier of entertainment, as it does presently, to acting as a supplier of communication services generally. These communication services will be two-way, and interactive.

Such two-way communications are expected to include audio and video telephony, ISDN-like digital services, and video servers. (Video servers store large amounts of video data, such as movies, at a central location, in a form which is compressed or encrypted, or both. The data is stored in a fast memory, such as solid-state RAM. To a user, the video server appears as a remotely located video tape machine. The user can order retrieval of stored data, such as a movie, causing the video server to transmit the data to the user.)

An interface will be necessary to allow each subscriber to transmit information to a local cable service provider. It is desirable that these interfaces be low in cost. The invention addresses one aspect of a cost-effective design for the interface.

The Inventor believes that all feasible interfaces will require a modulator to place information onto a radio frequency (RF) carrier for upstream conveyance, to the cable service provider. The Inventor proposes (1) a Surface Acoustic Wave (SAW) filter, for defining the RF modulator's bandwidth, and (2) a mixer for converting the upstream signal to another frequency. The conversion allows the frequency, or channel, used by the subscriber to be changed, and changed dynamically, if required.

SUMMARY OF THE INVENTION

In one form of the invention, a Gilbert Cell multiplier is modified, and is used as a mixer. It is mated with a SAW filter.

DETAILED DESCRIPTION OF THE INVENTION

Gilbert Cell Mixer

Figure 1:
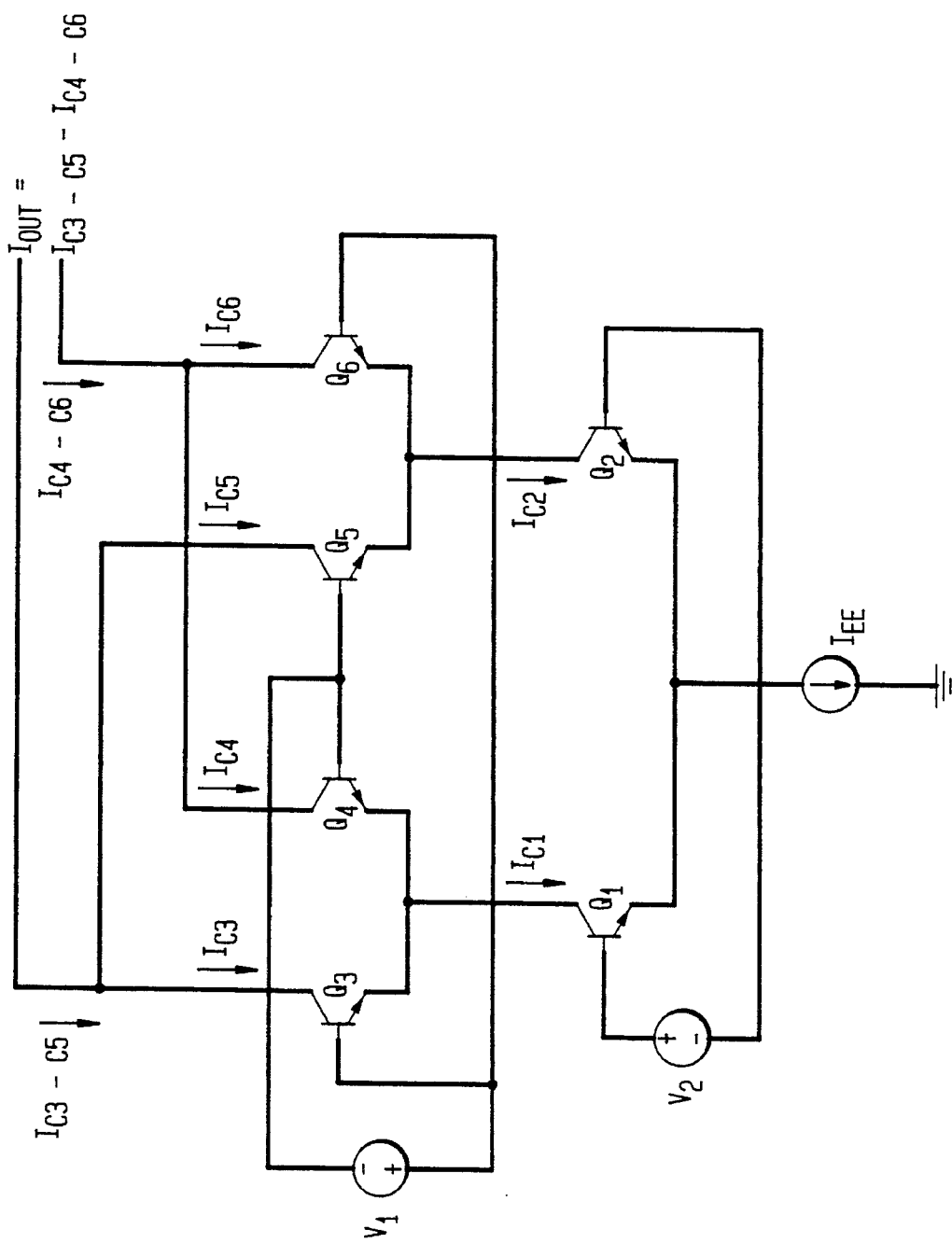
FIG. 1 illustrates a Gilbert multiplier.

Mixers, or multipliers, are used to multiply one signal by another. This multiplication is presently called modulation, and was originally called heterodyning. The Gilbert Cell is one type multiplier known in the prior art, and is shown in FIG. 1.

It can be demonstrated that the output of this multiplier is given by the following expression:

$$I_{C3-C5} - I_{C4-C6} = I_{EE} \times [\tanh(V_1/2V_T)] \times [\tanh(V_2/2V_T)] \quad (1)$$

wherein $I_{C3-C5}$ refers to $I_{C3}$ minus $I_{C5}$, $I_{C4-C6}$ refers to $I_{C4}$ minus $I_{C6}$, $I_{EE}$ refers to the current source, tanh refers to the hyperbolic tangent, and $V_T$ refers to the thermal voltage, which equals kT/q, wherein k is Boltzmann's constant, T is absolute temperature, and q is the charge of the electron.

[See P. Gray and R. Meyer, *Analysis and Design of Analog Integrated Circuits,* John Wiley, New York, 1993, ISBN 0-471-57495-3, chapter 10, section 10.3.1 et seq.]

It is a known fact that, for small x, the hyperbolic tangent of x approximately equals x itself, or, restated, tanh x≈x. Thus, equation (1) reduces to $$I_{C3-C5} - I_{C4-C6} \approx I_{EE} \times (V_1/2V_T) \times (V_2/2V_T). \quad (2)$$

Therefore, the Gilbert cell performs multiplication, as shown more clearly by re-writing equation (2) in the following forms:

$$I_{C3-C5} - I_{C4-C6} \approx [I_{EE} \times (1/4V_T^2)] \times V_1 \times V_2. \quad (3)$$

or $$I_{C3-C5} - I_{C4-C6} \approx M \times V_1 \times V_2 \text{ wherein } M = [I_{EE} \times (1/4V_T^2)] \quad (4)$$

Equation (4) indicates that, for a small signal, the Gilbert cell produces an output which equals a constant, M, multiplied by $V_1$ and $V_2$.

To illustrate modulation, assume that $V_1$ equals sin (At) and $V_2$ equals sin (Bt), wherein t is time. The output of the Gilbert cell becomes $$M \times [\sin (At)] \times [\sin(Bt)] \quad (5)$$

which equals, by applying a trigonometric identity, $$M \times [\sin (A-B)t + \sin (A+B)t]. \quad (6)$$

The output consists of two signals, at two different frequencies. One of the signals is used, and the other is discarded.

Experiment

Figure 2:
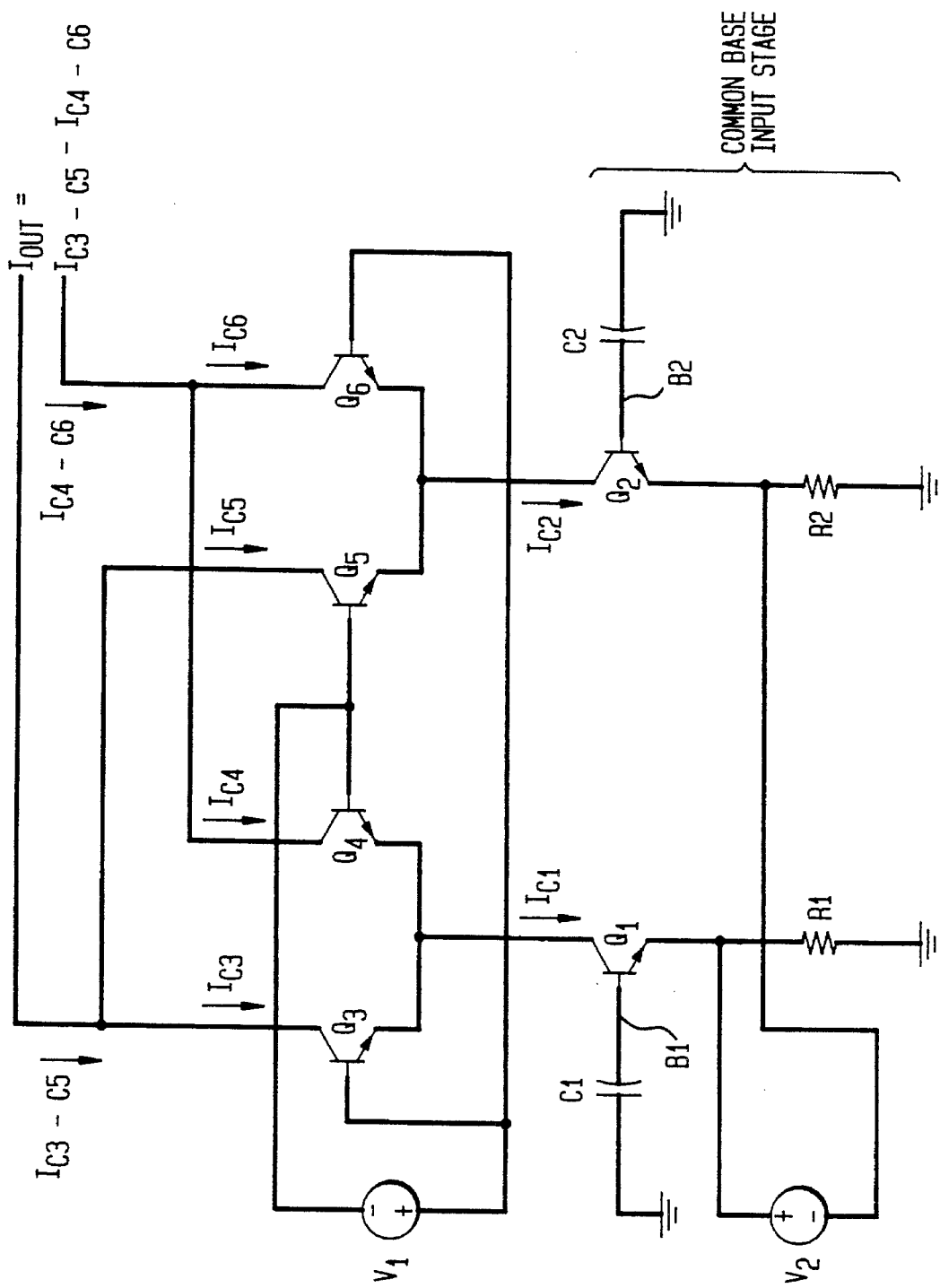
FIG. 2 illustrates one form of the invention.

The Inventor performed an experiment wherein he modified the Gilbert multiplier as shown in FIG. 2. In the original Gilbert multiplier, transistors Q1 and Q2 in FIG. 1 were configured in common-emitter mode (these transistors are NPN-BJTs, Bipolar Junction Transistors). The inventor replaced them by Q1 and Q2 in FIG. 2, which are NPN-BJT's configured in common-base mode.

The capacitors C1 and C2 were chosen to act as short circuits at the frequency of interest. They hold the bases B1 and B2 at small-signal ground. Capacitors of size 1,000 pF (picoFarad) were used. Resistor R1 and R2 were selected in order to provide an emitter current slightly above 1 mA (milli-Amp). R1 and R2 were large in comparison to each transistor's $R_e$, and, if 3 volts is applied to the bases of the transistors, values of 2 k-ohm for each are appropriate.

Figure 2A:
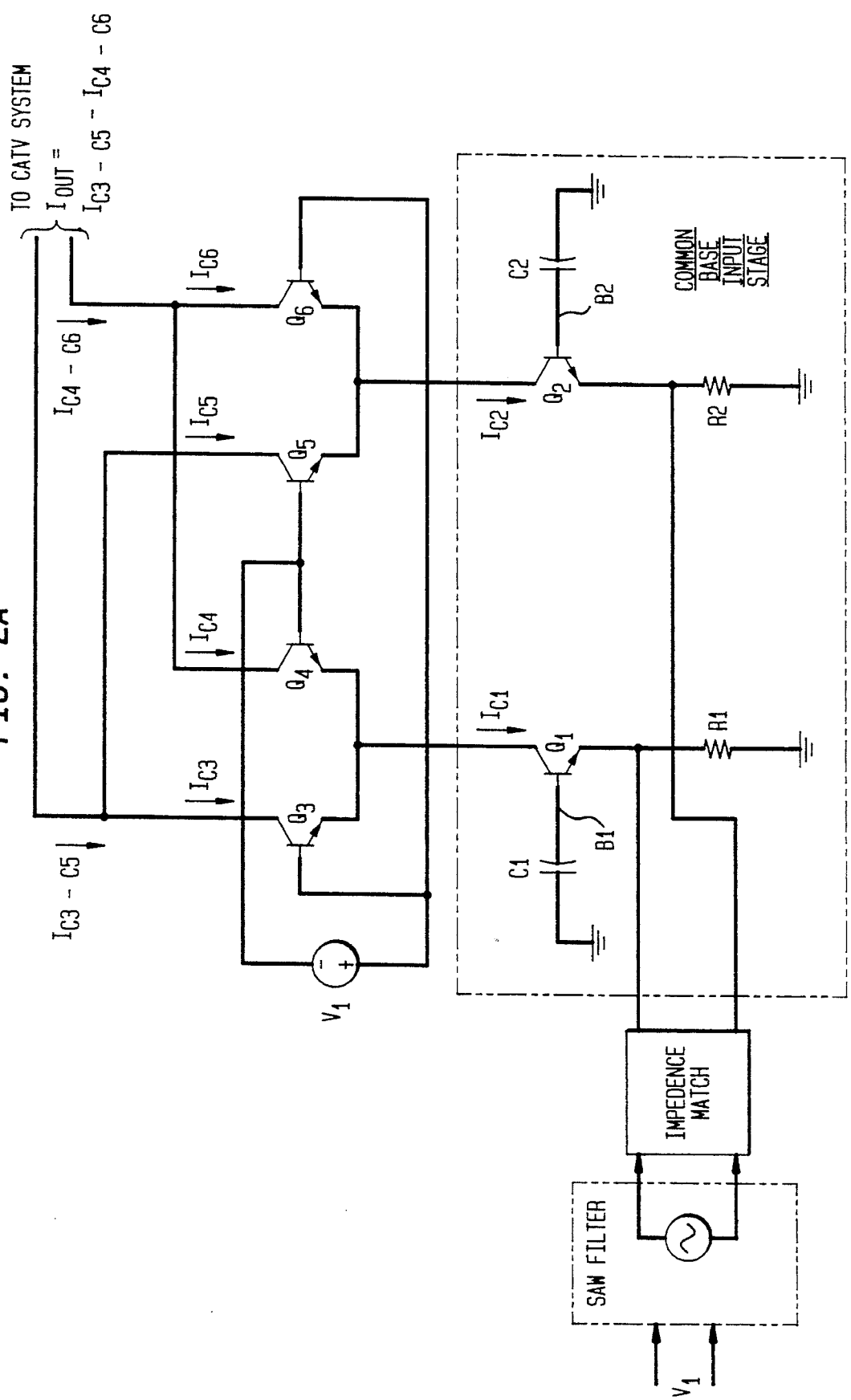
FIG. 2A illustrates additional components added to the apparatus of FIG. 2.

In FIG. 2A, a Surface Acoustic Wave filter, SAW, was interconnected between a signal source $V_s$ and the common-base input stage. The particular SAW used was a 45 MHz Transmitter Vestigial Sideband (VSB) filter, obtained from Siemens Corporation, and having a center frequency at 45.75 MHz. Such filters are commonly available at low cost, and are widely used in television transmission.

The 45.75 MHz carrier provided the IF (Intermediate Frequency) of the system. It was chosen because compatible SAWs are readily available, such as the one identified immediately above. However, it is preferred that the ultimate product utilize a slightly shifted frequency to circumvent possible interference with domestic television receivers which also use 45.75 MHz as the RF carrier, after down-conversion.

An IMPEDANCE MATCH stage in FIG. 2A was used because it was found that, at 45 MHz, the common-base input stage of the Gilbert Cell exhibited an inductive impedance. The IMPEDANCE MATCH stage cancelled this inductive component. The IMPEDANCE MATCH stage may not be necessary, depending on the imaginary component of impedance of the common-base input stage at the frequency of interest.

The LOCAL OSCILLATOR was a custom-built JFET configuration of a Varicap-controlled Colpitts oscillator, which spanned approximately 50 to 80 MHz. The actual power delivered across a 50-ohm resistor was on the order of 2 to 3 mW (milliWatts).

Experiment Used Commercially Available Gilbert IC

Figure 3:
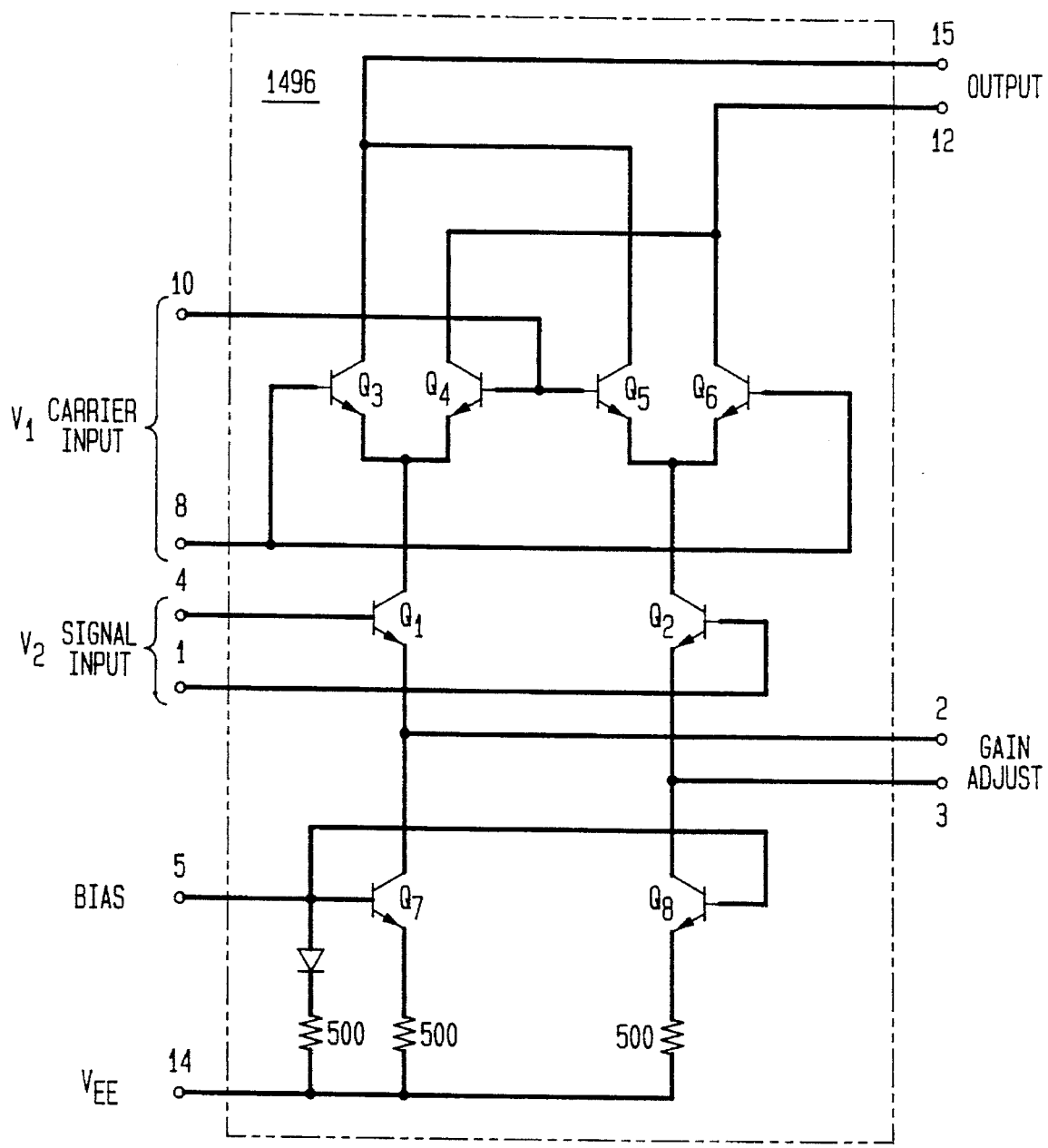
FIG. 3 illustrates pin connections of the Motorola MC 1496 Integrated Circuit (IC).

A Motorola MC 1496 Integrated Circuit (IC), available from Motorola Corporation, Schaumburg, Ill., provided many of the components shown in FIG. 2, in a pre-connected configuration. The pin connections for this IC are illustrated in FIG. 3.

Figure 4:
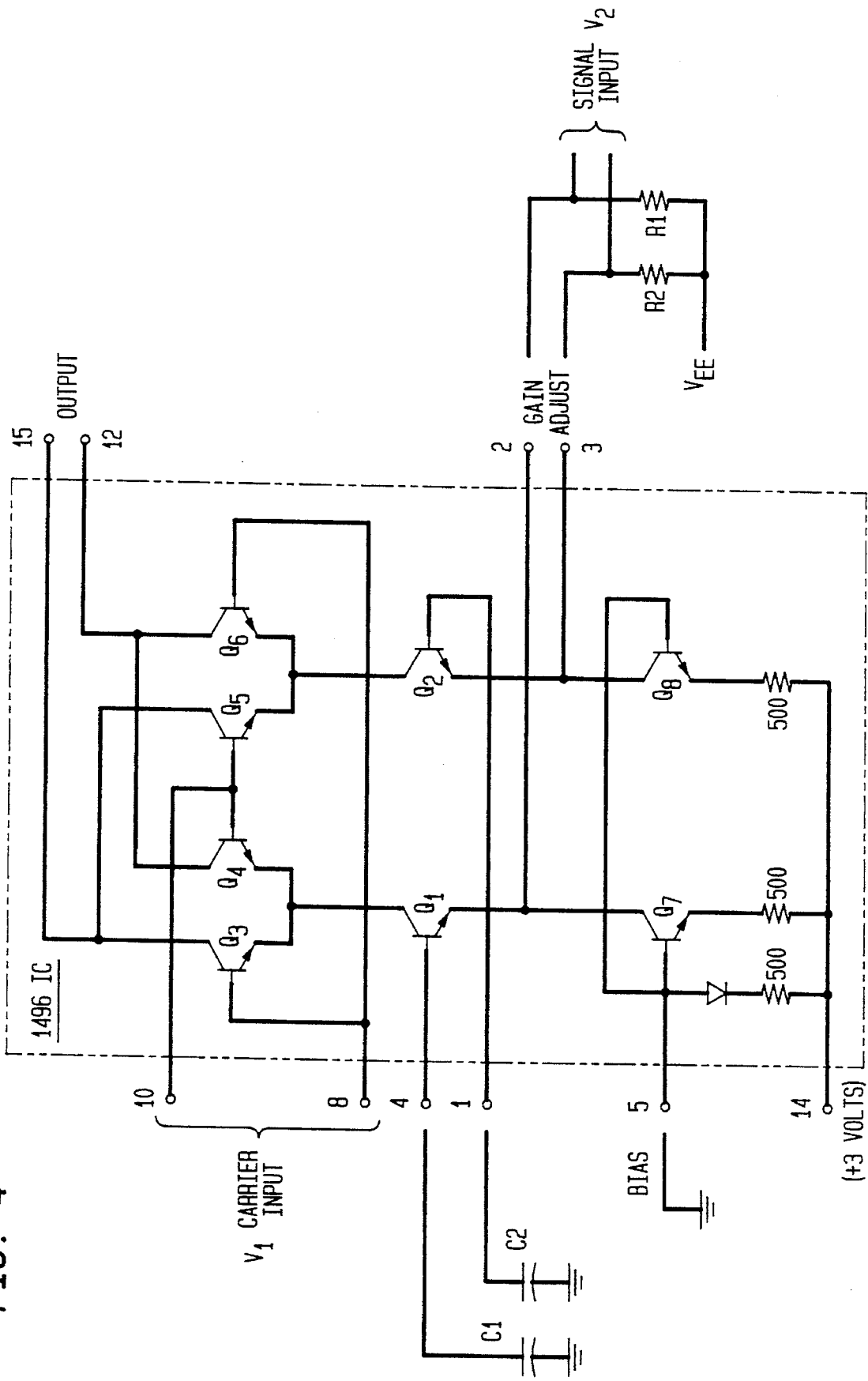
FIG. 4 illustrates how the IC of FIG. 3 can be connected to produce the circuit of FIG. 2.

The Inventor connected this IC as shown in FIG. 4, by adding the components drawn in dark lines. C1, C2, R1, and R2 had the values stated above.

Pin 5 (BIAS) was tied to circuit ground. Pin 14 was tied to approximately +3 volts, in order to turn off transistors Q7 and Q8, by reverse-biasing their base-emitter junctions. With these transistors turned off, they appear as open circuits to the emitters of Q1 and Q2. The resulting circuit is plainly equivalent to that shown in FIG. 2.

Significant Features

1. The circuit of FIG. 4 utilizes the MC 1496 integrated circuit, and provides a very inexpensive modulator. The MC 1496 is available, in quantities of 100, at a price of about $1.25 (U.S.) in 1994. It is reasonable to assume that, in quantities of 100,000 per year, the price will drop to the range of 30 cents.

2. The circuit of FIG. 4 was successfully driven by a local oscillator, (i.e., $V_1$, applied at the pins labeled CARRIER INPUT) which drew less than about 3.5 milliwatts of power (specifically, about two or three milliwatts). The local oscillator signal was less than about 150 millivolts, peak-to-peak (specifically, it was about 100 mV, peak-to-peak).

In general, low power consumption by the local oscillator is desirable, because the local oscillator, and circuit traces connected to it, radiate energy which causes interference. Nearby components must be shielded from this interfering radiation. Lower power consumption means lower radiation, which makes the shielding task easier.

3. A significant feature is the low input impedance (which can be designed to reach ohmic values of single digits, such as 2–10 ohms, using known techniques, described below) of the common-base input stage, which is much lower than the input impedance of the common-emitter input stage used in the standard Gilbert multiplier, shown in FIG. 1. This lower input impedance allows impedance-matching with devices which require a specified, low, load impedance, such as SAW filters. Further, the low input impedance is attained with a low parts count.

Figure 5:
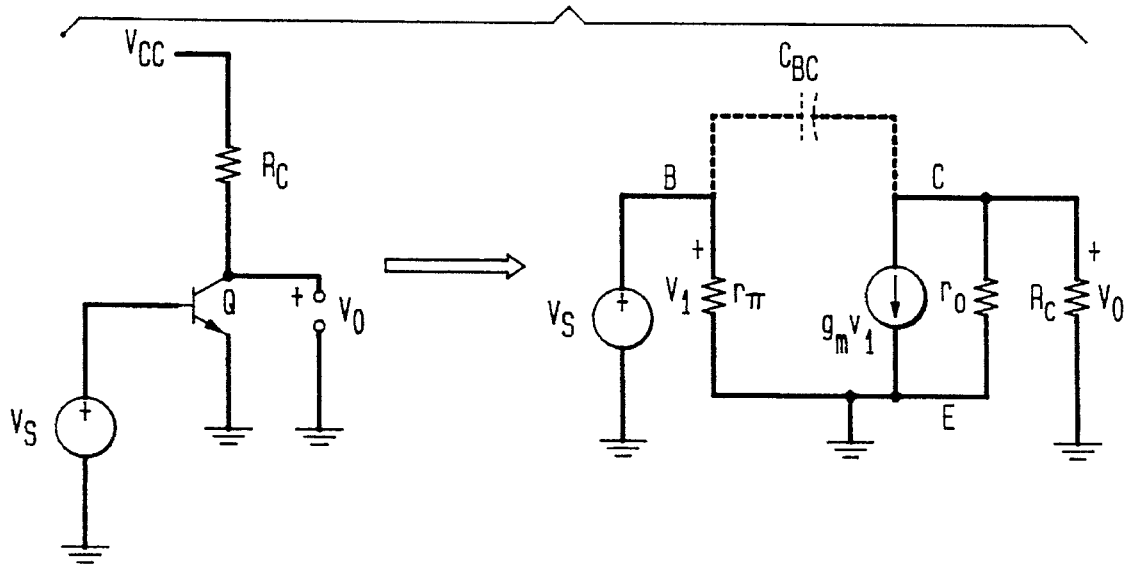
FIG. 5 illustrates the input impedance of a common-emitter amplifier.

The fact that a common-emitter amplifier has a high input impedance can be shown in a straightforward manner by FIG. 5, wherein a simplified hybrid-pi model for the transistor is substituted into the biasing circuit. The input impedance equals $r_\pi$. This resistance, $r_\pi$, generally lies in the range of thousands of ohms.

For the common-base configuration, the reader is directed to FIG. 6. Computing the input impedance is difficult with the circuit as shown in FIG. 6B, but can be simplified by rearrangement.

Figure 6A:
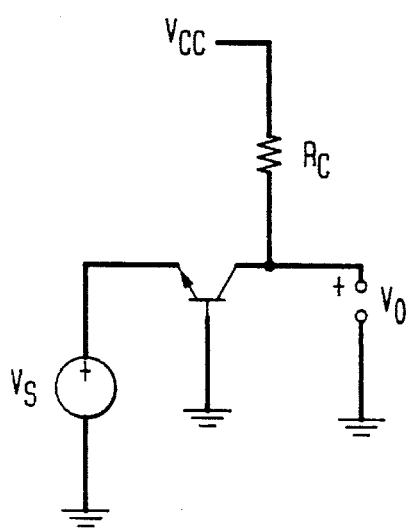
FIGS. 6A–6F illustrate the input impedance of a common-base amplifier.
Figure 6B:
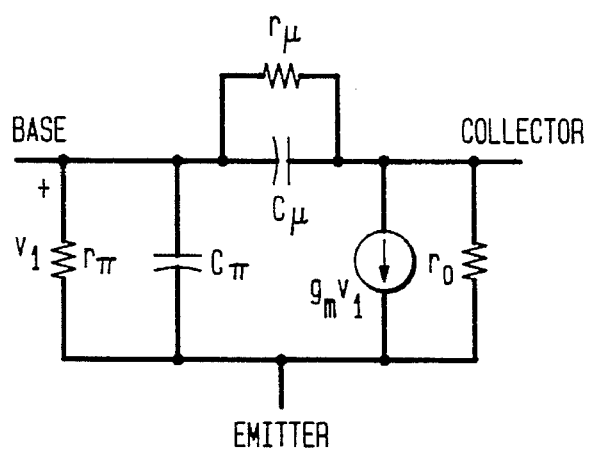
Figure 6C:
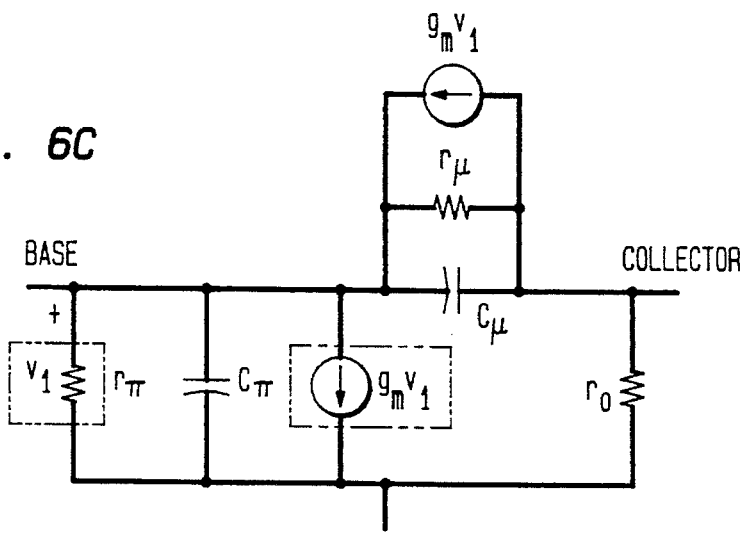

First, the single current source, $g_m v_1$, is replaced by two current sources, both of the same value, producing the circuit of FIG. 6C. Examination of the circuit shows that the currents entering and leaving all nodes are the same as before, so that the two circuits are equivalent.

Next, it is observed that the current source contained within the dashed box depends on $v_1$, also boxed, which is the voltage across the current source itself. Consequently, this current source can be replaced by a resistor of value $1/g_m$. (Rationale: $I = g_m v_1$ in this case, $I=V/R$ in general, so that $g_m=1/R$ in this case.)

Figure 6D:
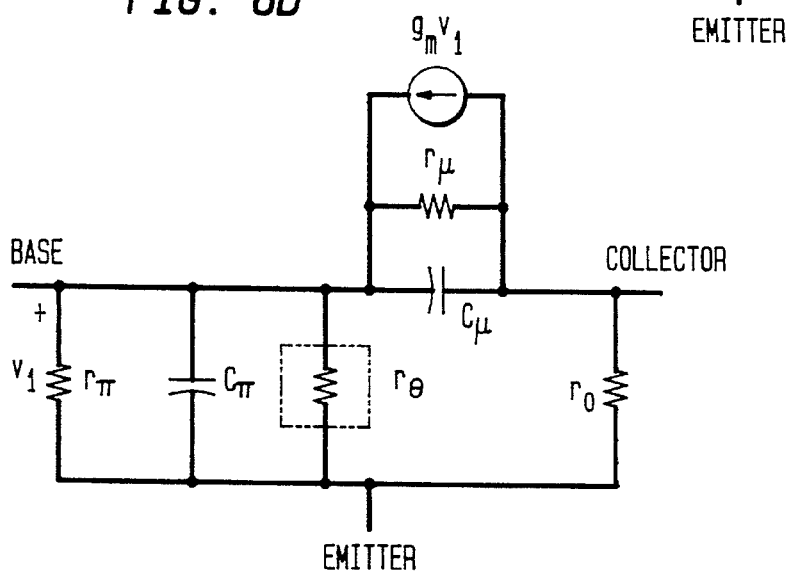
Figure 6E:
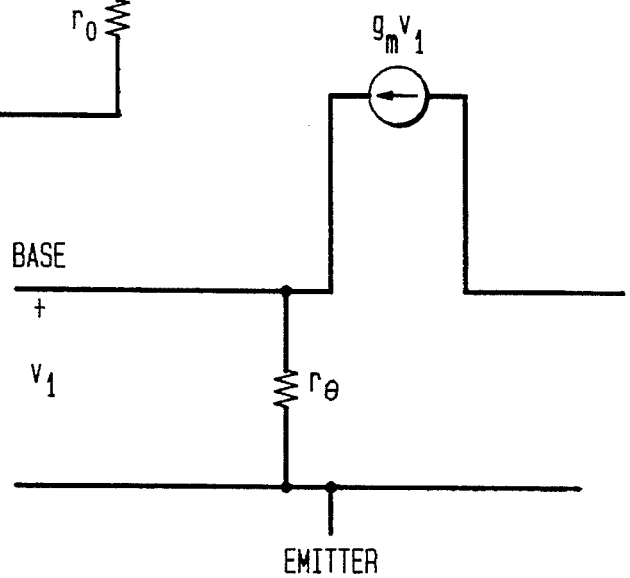

This replacement is indicated by the boxed resistor in FIG. 6D. This circuit is simplified in FIG. 6E, wherein large resistances have been replaced by open circuits, and capacitors eliminated.

Figure 6F:
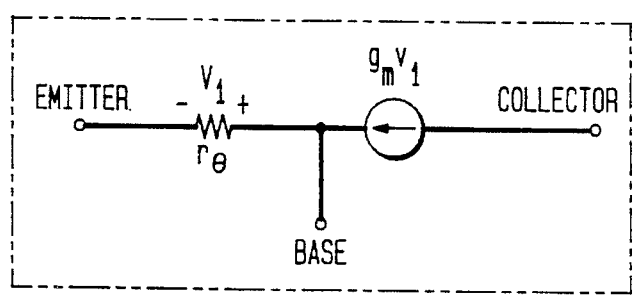

FIG. 6F re-arranges the circuit, and shows that the input impedance equals $r_e$, which equals $1/g_m$. This input impedance varies from transistor-to-transistor, of course, but attaining $r_e$ in the range of 25 ohms is feasible.

From another perspective, $r_e$ depends on $I_E$, which is DC bias current through the emitter, because it is known that $$r_e = V_T / I_E$$

$I_e$ is emitter DC bias current, and $V_T$ is thermal voltage, as discussed at the beginning of the Detailed Description of the Invention.

Thus, input impedance, $r_e$, is variable, and within the control of the designer.

For example, assume that input impedance is found to be 20 ohms at an emitter bias current, $I_E$, of 2 mA. If emitter bias current is doubled, then input impedance is cut in half, and vice versa. It is within the skill of the art, based on the teachings contained herein, to attain an input impedance as low as one or two ohms, by adjusting $I_E$, by adjusting biasing resistors.

4. The balanced output of the SAW in FIG. 2A, when applied to the input stage, sees an input impedance of two $r_e$'s in series. In the Experiment, this series resistance was about 50 ohms, or 2 ×25 ohms.

Figure 7:
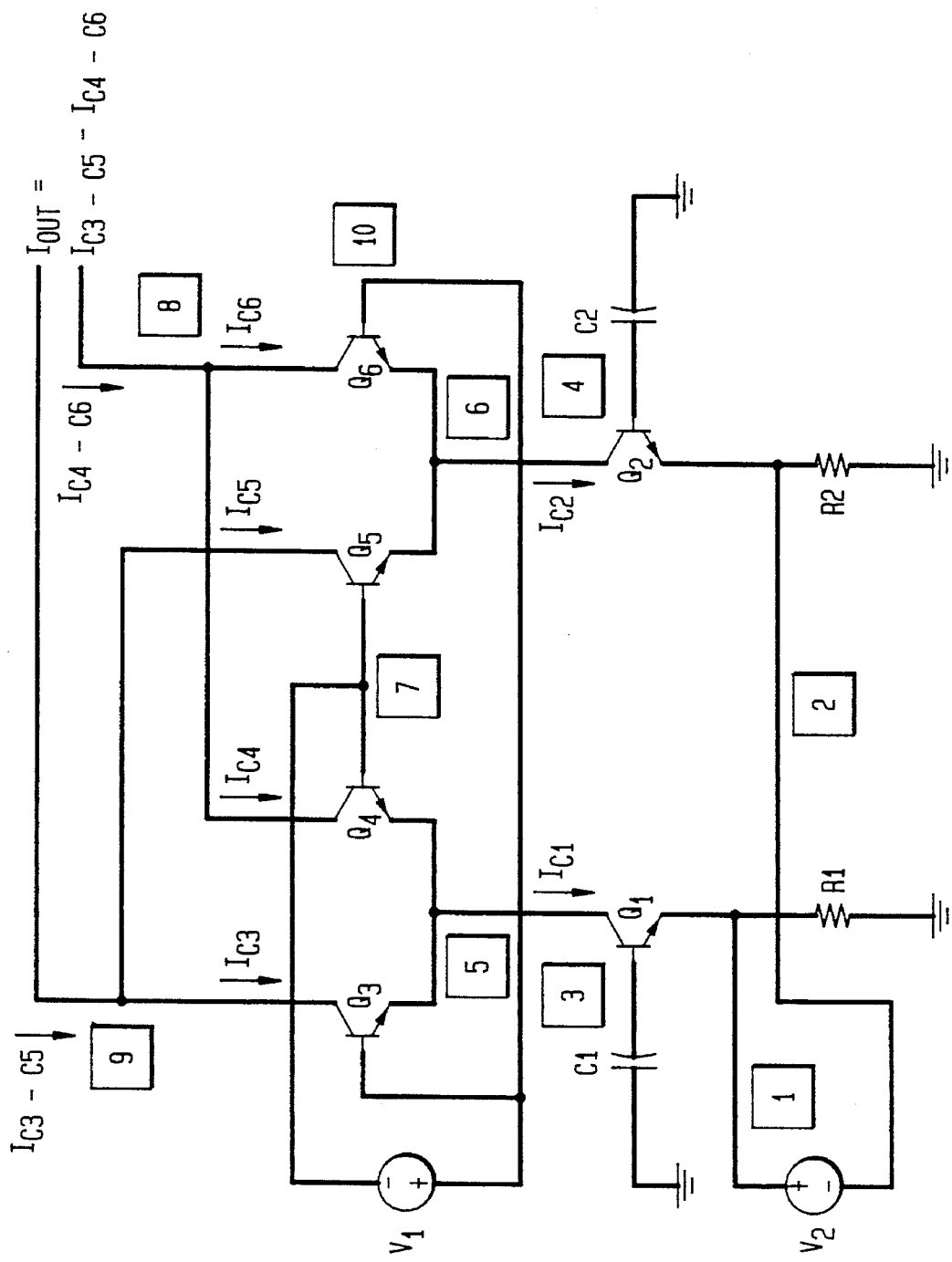
FIG. 7 adds labels to the nodes of FIG. 2.

5. FIG. 7 shows one form of the invention, with the nodes labeled for purposes of defining a netlist for a circuit-analysis program such as SPICE. The netlist is the following:

1 R1 0, 1, VALUE
2 R2 0, 2, VALUE
3 C1 3, 0, VALUE
4 C2 4, 0, VALUE
5 Q1 5, 3, 1
6 Q2 6, 4, 2
7 Q3 9, 10, 5
8 Q4 8, 7, 5
9 Q5 9, 7, 6
10 Q6 8, 10, 6.

The local oscillator is applied to nodes 7 and 10, while the signal is applied to nodes 1 and 2.

The syntax of this netlist can be explained by three examples. As a resistor example, in line 1, "R1, 0 1, VALUE" means that component R1 is connected between nodes 0 (ground) and 1, and VALUE is the value of the resistor. For a 50-ohm resistor connecting between nodes 0 and 1, the netlist entry would be "R1 0, 1, 50."

As a capacitor example, in line 3, "C1 3, 0, VALUE" means that component C1 is connected between nodes 3 and 0, and has the given VALUE. For a 100,000 micro-Farad capacitor, the netlist entry would be "C1 3, 0, 0.1."

For bipolar junction transistors, the syntax is "Transistor Identification, collector node, base node, emitter mode." Thus, in line 5, "Q1 5, 3, 1" means that node 5 connects to the collector of transistor Q1, node 3 connects to the base, and node 1 connects to the emitter.

6. It should be observed that the invention provides an extremely simple approach to impedance-matching to SAWs. The frequency of the signal delivered by the SAW can be expected to lie above 5 MHz, and probably in the range of 50 MHz to 100 MHz. (However, SAW filters have been constructed which operate in excess of one GHz, so that use of the invention at such higher frequencies can be expected.)

Matching the output of the SAW to the normal, common-emitter, signal input of the Gilbert multiplier would be impossible, using lumped elements. The SAW needs a small load impedance, such as a few ohms, and almost certainly below 200 ohms. An impedance-matching network constructed of lumped elements (resistors, capacitors, and inductors) cannot convert the high input impedance of the common-emitter stage to the low impedance needed, because lumped elements acquire complex impedances at these frequencies, instead of behaving like purely real, or purely imaginary, impedances.

7. It is not necessary to use a Gilbert multiplier. Other multipliers can be used.

8. The common-base stage provides wider bandwidth than the common-emitter stage, because the common-base stage eliminates the Miller feedback capacitance.

A capacitance $C_{BC}$, shown in FIG. 5, lies between base and collector. In the common-emitter amplifier shown, the input signal is applied to the base B, and the output signal is taken at the collector C. Thus, this capacitance $C_{BC}$ provides a feedback path between base B and collector C.

Figure 8:
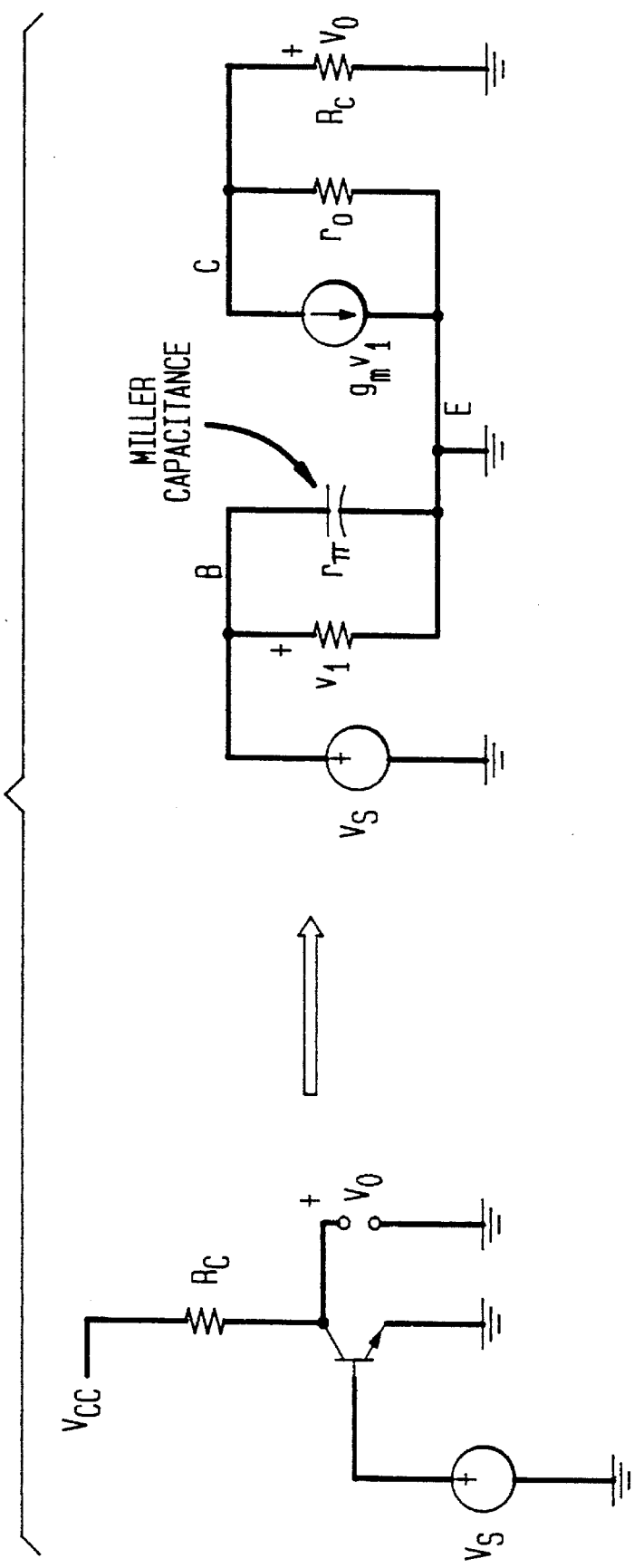
FIG. 8 illustrates Miller capacitance.

This feedback capacitance can be modelled as a capacitor in parallel with $r_\pi$, as shown in FIG. 8. This parallel capacitance is called the Miller capacitance. However, for various reasons which need not be explained here, the Miller capacitance is significantly larger than the actual base-collector capacitance $C_{BC}$.

The Miller capacitance, together with the parallel $r_\pi$, provides a time constant which has a significant effect on the high-frequency break point. This time constant, in effect, determines the frequency of the break point, and thus determines the bandwidth.

In contrast, with the common-base stage, FIG. 6, $C_{BC}$ (labeled $C_\mu$) does not connect between input and output; it connects between output and ground (the base is grounded). $C_{BC}$ is still present, but does not behave like a large Miller capacitance. Consequently, larger bandwidth is obtained, compared with the common-emitter stage.

9. Four significant advantages of the invention are the following:

A) Frequency conversion is attained without significant signal loss, and which significantly enhances the ratio between the desired RF channel input and undesired spurious outputs on other channels. This is to be contrasted with comparable passive mixing techniques, which are lossy, and utilize more power supply current for amplification of the local oscillator and signal.

B) Frequency extension is attained by using inexpensive, commonly available Gilbert Cell IC's, and by use of common-base drive.

C) Lowered product cost and lowered design risk is attained. Because the local oscillator consumed the low power discussed above, the risk of electromagnetic interference and problems of electromagnetic incompatibility have been reduced.

D) Simple impedance match to a balanced SAW filter output is attained. A commonly specified load for a SAW filter is 50 ohms. The Gilbert Cell common base input configuration is easily tailored to match this load.

10. For various practical reasons, which need not be elaborated here, the load impedance seen by the SAW filter should not exceed 200 ohms.

Numerous substitutions and modifications can be undertaken without departing from the true spirit and scope of the invention. What is desired to be secured by Letters Patent is the invention as defined in the following claims.

I claim:

1. A modulator, comprising:
   a) a SAW filter for receiving a signal;
   b) a Gilbert multiplier which includes
      i) an input for receiving the signal from the SAW filter; and
      ii) means for adjusting the impedance of the input.

2. In a multiplier for a signal, the improvement comprising:
   a) a SAW filter for delivering the signal; and
   b) Gilbert multiplier means for receiving the signal at a port
      i) having an input impedance of less than 200 ohms, and
      ii) having no significant Miller capacitance.

3. The combination comprising;
   a) a Gilbert multiplier which includes a signal input port, and a carrier input port, and
   b) means for providing, at the signal input port, an input impedance less than 200 ohms.

4. A modulator, comprising:
   a) a Surface Acoustic Wave (SAW) filter
      i) for delivering an information signal; and
      ii) requiring a load impedance of less than 200 ohms.
   a) a multiplier which
      i) has a signal input port which presents an input impedance of less than 200 ohms;
      i) receives the information signal from the SAW at the input port; and
      ii) multiplies the information signal by a carrier signal which exceeds 10 MHz.

5. A modulator, comprising:
a) an integrated circuit (IC) which contains a Gilbert multiplier, and which includes a pair of signal input pins; and
b) means for causing the pair of signal input pins to present an input impedance of less than 200 ohms.

6. A modulator, comprising:
a) a Gilbert-type multiplier having first and second input ports, for multiplying signals presented to the ports by each other, in which the first port has an input impedance of less than 200 ohms;
b) a signal source;
c) a Surface Acoustic Wave (SAW) filter connected between the signal source and the first input port; and
d) oscillator means, connected to the second input port, for delivering no more than 3.5 milliwatts of power to the second input port.

7. A mixer which comprises components connected according to the following netlist, which follows SPICE syntax, 1 R1 0, 1
2 R2 0, 2
3 C1 3, 0
4 C2 4, 0
5 Q1 5, 3, 1
6 Q2 6, 4, 2
7 Q3 9, 10, 5
8 Q4 8, 7, 5
9 Q5 9, 7, 6
10 Q6 8, 10, 6.

wherein nodes 7 and 10 represent a first input port, nodes 1 and 2 represent a second input port.

8. Apparatus according to claim 7 and further comprising a Surface Acoustic Wave (SAW) filter for delivering an information signal to the second port.

9. A method of transferring data, comprising:
a) filtering a signal provided by a signal source through a Surface Acoustic Wave (SAW) filter;
b) applying the filtered signal to a Gilbert multiplier, which is modified to comprise a common-base input stage;
c) applying a local oscillator signal to another input of the Gilbert multiplier; and
d) delivering the output of the Gilbert multiplier to a transmission line which carries cable television signals.

10. For an integrated circuit containing a Gilbert multiplier which has a signal-input stage internally biased in common-emitter mode, the improvement comprising:
a) means for converting the signal-input stage to common-base mode.

11. Apparatus according to claim 10, and further comprising
b) a signal source for providing a signal to the signal-input stage; and
c) a surface acoustic wave filter for filtering the signal prior to reaching the signal-input stage.

12. For an integrated circuit (IC) comprising a Gilbert multiplier, and including the following components:
A) a pair of signal input pins, connected to respective bases of first and second BJTs, which are connected within the IC in common-emitter mode;
C) a pair of GAIN ADJUST pins, connected to respective emitters of said BJTs;
D) a BIAS pin connected to bases of third and fourth BJTs, which receive current from the first and second BJTs; and
E) an emitter power supply pin ($V_{EE}$),
the improvement comprising:
a) means for grounding the BIAS pin,
b) means for creating a pair of signal shorts, each between a respective signal pin and ground,
c) means for applying a signal to the GAIN ADJUST pins,
d) means for turning off the third and fourth BJTs, to thereby bias the first and second BJT's in common-base mode.

* * * * *